(12) United States Patent
Hovin et al.

(10) Patent No.: US 6,362,769 B1
(45) Date of Patent: Mar. 26, 2002

(54) ANALOGUE-TO-DIGITAL CONVERSION USING FREQUENCY-MODULATED INPUT OR INTERMEDIATE VALUES

(76) Inventors: Mats Erling Hovin, Skallerudveien 59, Oslo (NO), N-1188; Tor Sverre Lande, Bakerovnsgrenda 62, Baerums Verk (NO), N-1353

( * ) Notice: Subject to any disclaimer, the term of this patent is extended or adjusted under 35 U.S.C. 154(b) by 0 days.

(21) Appl. No.: 09/424,927

(22) PCT Filed: Jun. 2, 1998

(86) PCT No.: PCT/GB98/01605

§ 371 Date: Mar. 6, 2000

§ 102(e) Date: Mar. 6, 2000

(87) PCT Pub. No.: WO98/56115

PCT Pub. Date: Dec. 10, 1998

Related U.S. Application Data

(60) Provisional application No. 60/048,276, filed on Jun. 2, 1997.

(30) Foreign Application Priority Data

Jun. 2, 1997 (GB) ................................................. 9711374

(51) Int. Cl.[7] .............................................. H03M 1/60
(52) U.S. Cl. ........................ 341/157; 332/117; 331/57
(58) Field of Search ................................ 341/157, 155, 341/143; 332/117; 331/57

(56) References Cited

U.S. PATENT DOCUMENTS

| 4,243,977 A | * | 1/1981 | Everard ................ 340/347 DD |
| 4,281,318 A | * | 7/1981 | Candy et al. ................ 340/347 |
| 4,916,403 A | * | 4/1990 | Sudoh et al. ................ 328/155 |
| 5,095,264 A | * | 3/1992 | Hulsing, II ................ 324/79 D |

FOREIGN PATENT DOCUMENTS

| EP | 0 484 975 A2 | 5/1992 | ........... G01R/23/00 |

* cited by examiner

*Primary Examiner*—Peguy JeanPierre
(74) *Attorney, Agent, or Firm*—Alix, Tale & Ristas, LLP

(57) ABSTRACT

A method of and apparatus for the conversion of a frequency modulated signal to a digital output are disclosed. The output of the converter is a triangularly weighted sum of the number of zero crossings of the F.M. signal in each sub-sampling interval over a sampling interval T.

27 Claims, 14 Drawing Sheets

US 6,362,769 B1

ANALOGUE-TO-DIGITAL CONVERSION USING FREQUENCY-MODULATED INPUT OR INTERMEDIATE VALUES

CROSS-REFERENCE TO RELATED APPLICATION

This is the U.S. national phase of International Application No. PCT/GB98/01605 filed Jun. 2, 1998 which claims priority of U.S. Provisional Application No. 60/048,276 filed on Jun. 2, 1997.

BACKGROUND OF THE INVENTION

The present invention relates to signal processing and in particular to the conversion of frequency modulation (FM) signals to corresponding digital signals and/or the conversion of analogue signals to corresponding digital signals.

The present inventors have described in a paper entitled "Delta-Sigma Modulators using Frequency-Modulated Intermediate Values" (Høvin, M., Olsen A., Lande, T. S., Toumazou, L., I.E.E.E. J. Solid State Circuits, Vol. 32, No. 1, January 1997) a circuit wherein a carrier signal is frequency modulated with an analogue input signal x(t) to produce a frequency modulated signal fm(t). The rising edges of the frequency modulated signal fm(t) are counted by a digital modulo $2^n$ counter and the total count is sampled at a sampling frequency $f_s$. The sampled counts are differentiated to produce a digital output $y_n$ corresponding to the analogue input signal x(t).

This known circuit exhibits good signal to noise properties as the counting operation effectively integrates the analogue input signal x(t) before the sampling operation. Thus, it is the integrated input signal that is sampled and to which quantization noise $Q_n$ is added. After the sampling operation, the quantized integrated input signal, together with the quantization noise Q, is differentiated to produce the output signal $y_n$. The digital output signal $y_n$ is therefore given by equation 1

$$y_n = x_n + (1 - Z^{-1})Q \quad (1)$$

where $Z^{-1}$ represents the unit delay operator and $x_n$ is the quantized value of x(t). The multiplication of the quantization noise Q by $(1-Z^{-1})$ is equivalent to first order delta-sigma noise shaping which results in an improvement in the signal to noise ratio of the analogue to digital converter.

This type of basic frequency to digital converter is known as a 'count and dump' converter, as the number of rising edges of the FM signal is continuously counted and the difference between the count in successive sampling periods $T_s$ (=$1/f_s$) is 'dumped' to the output. Such a count and dump system may also be used in an oversampling configuration such that the count of rising edges in successive sampling periods $T_s$ is summed and decimated to give an estimate of the instantaneous frequency in a decimation period $T_d=1/f_d$, where $f_s>f_d$.

The present invention seeks to improve on the known 'count and dump' frequency to digital converters and analogue to digital converters.

SUMMARY OF THE INVENTION

According to a first aspect of the present invention, there is provided a method of converting an oscillating signal to a digital signal representative of the frequency of the oscillating signal over a sampling interval T, wherein the occurrence of corresponding points of successive cycles of the oscillating signal are counted, the count is sampled at a first sampling frequency $f_s$, where $1/f_s<T$, to give a plurality of values of the count for a plurality of sampling sub-intervals $T_s$ and the sub-interval counts are summed to provide an output, characterised in that each sampled count value is weighted by a weight which is a function of the position of the respective sub-interval $T_s$ in the interval T.

Thus, according to the method of the invention weighting information is applied to the cycle count for each sub-interval $T_s$ such that the digital output produced by this method is a weighted sum of the counts for each sub-interval $T_s$ over the sampling interval T. In this way, information is included in the output which relates to the position of each sub-interval in the sampling interval and the signal to noise ratio is thereby increased. In known 'count and dump' converters, the count for each sub-interval $T_s$ has an equal weight and thus no positional information is included.

Preferably, the weighting function has a minimum value at the start and end of the sampling interval T and may have a maximum value in the centre of the sampling interval. In this way, the sub-intervals in the central region of the interval T are given a greater weight than those at the edges which may be clipped by the sampling operation. The weighting function is preferably symmetrical so that sub-intervals at equivalent portions at either side of the centre of the sampling interval are given equal weights.

In the preferred embodiment, the weighting is triangular, although other weighting functions could be used equally well. Across the interval T, the applied weight increases linearly, for example by 1 per $T_s$, from a minimum at the first sub-interval until the maximum weight is reached at the centre sub-interval, the weight then decreasing linearly, for example by 1 per $T_s$, to a minimum at the last sub-interval.

Preferably the output is provided at a frequency greater than $1/T$ such that the sampling intervals T associated with successive digital outputs overlap, in the sense that at least two successive digital outputs contain count values associated with, at least some, common sub-intervals $T_s$. In the preferred embodiment the output frequency $f_d$ (=$1/T_d$) and $T=2T_d$. Thus two successive digital outputs D (=$T_d/T_s$) sub-intervals in common, although for each output the count for each $T_s$ will be given a different weight, as it will appear at a different position in the respective sampling interval T. The quantity D is the decimation ratio.

The weighting may be applied to each count by any suitable arrangement of signal processing components. However, in the preferred embodiment the continuous count is summed over successive sub-intervals $T_s$, the summed count is sampled at a regular decimation interval $T_d$ and the sampled sum is differentiated twice by differentiators synchronised to $T_d$. The output according to this method is a triangularly weighted sum of the number of occurrences of the corresponding points in successive cycles of the oscillating signal in each sub-interval $T_s$, across a sampling interval of $2T_d$.

This is in itself believed to be a novel configuration and thus in a preferred arrangement there is provided a method of converting an oscillating signal to a digital signal representative of the instantaneous frequency of the oscillating signal, wherein the oscillating signal is applied to a digital counter which counts the occurrence of corresponding points of successive cycles of the oscillating signal, the output of the counter is sampled at a first sampling frequency $f_s$, the sampled output is summed over successive sampling sub-intervals $T_s$, the summed counts are sampled at a second sampling frequency $f_d$ and are then differentiated twice by successive differentiators clocked at the second sampling frequency $f_d$ to provide an output. One advantage of this method is that the quantization noise resulting from the sampling is delta sigma noise shaped.

The corresponding points on the successive cycles of the oscillating signal are preferably rising or falling edges of the signal. Advantageously the digital counter may be in the form of an accumulator clocked by the rising or falling edge of the oscillating signal and arranged to increase the stored count by one when clocked by the rising (or falling) edge of the signal. Alternatively, a latch may be used to sample a limited oscillating signal. The sampling frequency may be applied to the clocking input of the latch and the limited oscillating signal may be applied to the latch input of the latch. The output of the latch may then be used as a clocking signal for a counter.

For the above described methods to be applied to the conversion of an analogue signal to a corresponding digital signal, the analogue signal need only be used to frequency modulate a carrier frequency. The above-described methods may then be used to obtain a digital signal corresponding to the instantaneous frequency of the frequency modulated signal which will correspond to the analogue signal.

The invention also extends to the circuits employed to put the above described methods into effect.

Thus, from a second aspect the invention provides a converter for converting an oscillating signal to a digital signal representative of the frequency of the oscillating signal over a sampling interval T, the converter comprising a counter arranged to continuously arranged to sample the output of the counter at a sampling frequency $f_s$, characterised in that the converter further comprises weighting means to produce an output in the form of a weighted sum of the sampled counts over a sampling period T.

BRIEF DESCRIPTION OF THE DRAWINGS

Some embodiments of the invention will now be described by way of example only and with reference to the accompanying drawings, in which.

DETAILED DESCRIPTION OF THE PREFERRED EMBODIMENT

Figure 1:
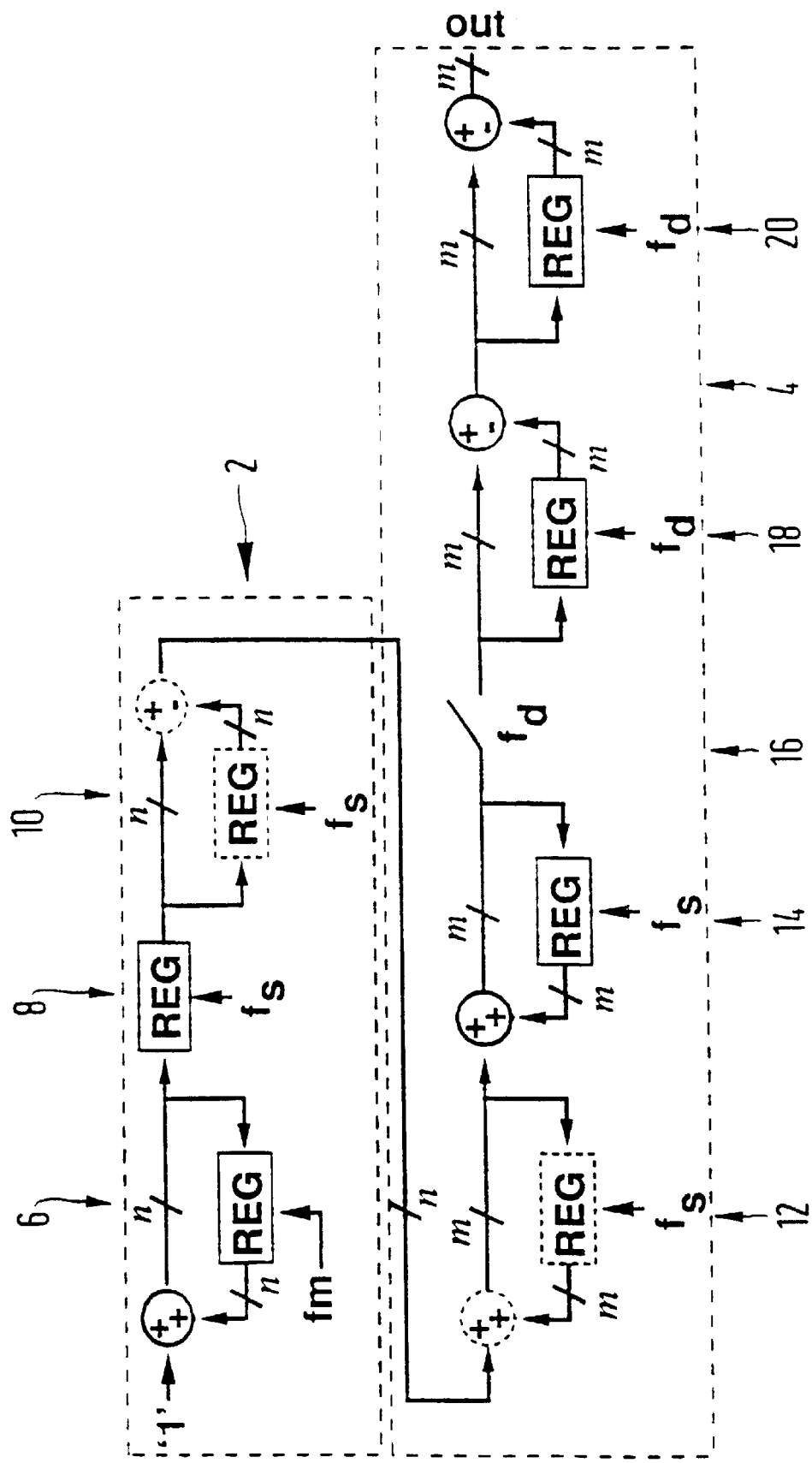
FIG. 1 shows a schematic diagram of a frequency to digital converter according to an embodiment of the invention.

FIG. 1 shows a schematic diagram of a frequency to digital converter according to a first embodiment of the invention. The converter comprises an oversampled frequency delta sigma modulator (FΔΣM) 2 whose output is fed to a sinc$^2$ decimator 4. The FΔΣM 2 comprises, as a phase detector, a modulo $2^n$ accumulator 6 the register of which is clocked by the rising edges of the input frequency modulated signal FM. Each time the register is clocked by a rising edge the adder of the accumulator 6 adds a binary 1 to the content of the register and thus the output of the accumulator 6 is an n-bit word equal to the number of rising edges (positive zero crossings) that have occurred in the FM signal since the beginning of operation of the circuit.

The output of the accumulator 6 is fed to a register 8 which is clocked by the sampling frequency $f_s$. Thus, the register stores for an interval $T_s=1/f_s$ the instantaneous output of the accumulator 6 i.e. the total number of rising edges that have occurred up to the end of the latest sampling sub-interval $T_s$. The register 8 therefore samples the asynchronous output of the accumulator 6 at a sampling frequency $f_s$ to give a synchronous output which is a digital value equivalent to the instantaneous frequency of the FM signal over the sampling sub-interval $T_s$.

The output of the register 8 is fed to a differentiator 10 which subtracts the output of the register 8 for the previous sampling sub-interval from the output for the present sampling sub-interval. Thus, the output of the differentiator 10 is an n-bit word equal to the number of rising edges in the current sampling sub-interval $T_s$.

The output of the differentiator 10 is fed to the input of the sinc$^2$ decimator 4. The sinc$^2$ decimator 4 comprises a modulo $2^m$ accumulator 12 clocked by the sampling frequency $f_s$ followed by an identical accumulator 14. Thus, the output of the series of two accumulators 12,14 is a sum of the sum of rising edges occurring since the beginning of operation of the circuit.

The output of the series of two accumulators is fed to a switch 16 which operates at the decimation frequency $f_d$. The ratio of the decimation interval $T_d$ to the sampling sub-interval $T_s$ is D (=$T_d/T_s=f_s/f_d$), the decimation ratio. Thus, every D sampling sub-intervals the output of the series of accumulators 12,14 is fed to the next stage 18,20 of the sinc$^2$ decimator 4.

The next stage of the sinc$^2$ decimator 4 is a series of two differentiators 18,20 which are each clocked by the decimation frequency $f_d$. Thus, the output of the sinc$^2$ decimator, and therefore the converter of FIG. 1, is the sum of the sums of the rising edges occurring since the beginning of the operation of the circuit differenced over two decimation intervals $T_d$. In the sinc$^2$ decimator 4 the input is integrated twice before being down-sampled at frequency $f_d$ and is then differentiated twice. Thus, the sinc$^2$ decimator 4 also performs delta sigma noise shaping.

The operation of the above circuit will be described in more detail in relation to FIG. 2 which shows a simplified version of the circuit of FIG. 1. For the FΔΣM, the minimum word-length n is a function of the maximum frequency deviation Δf of the FM signal divided by $f_s$. The minimum word-length m for the following sinc$^2$ decimator will generally be much larger than n. However, if, in the circuit of FIG. 1, n is set equal to m, the differentiator 10 is the inverse of the following accumulator 12 and thus these two components may be removed. Thus, by setting n=m the circuit of FIG. 2 can be created from that of FIG. 1. The circuit of FIG. 2 may be considered as a sinc$^2$ decimator wherein the first accumulator is replaced by an asynchronous counter clocked by the rising edge of the FM signal. The operation of this circuit will now be described in detail. If the FM signal is considered to be modulated with an analogue signal x(t), then the output $a_n$ of the register 8 for the n$^{th}$ sampling sub-interval can be described by the following equation:

$$a_n = \sum_{j=-\infty}^{j=n} x_j \quad (2)$$

where $x_j$ represents the number of rising edges occurring in the j$^{th}$ sampling sub-interval, which is an estimate of the instantaneous frequency of the F.M. signal, which is in turn equivalent to a sample of the modulating analogue signal x(t) in the j$^{th}$ sampling sub-interval.

The output $b_n$ of the accumulator 14, for the n$^{th}$ sampling sub-interval can be expressed as $$b_n = \sum_{k=-\infty}^{k=n} a_k \quad (3)$$

and the input $c_n$ from the switch 16 to the differentiator 18 for the n$^{th}$ decimation interval can be expressed as $$c_n = b_{Dn} = \sum_{k=-\infty}^{k=Dn} a_k \quad (4)$$

because the switch operates every D sampling sub-intervals. The output $d_n$ of the differentiator 18 is given by $$d_n = c_n - c_{n-1} \quad (5)$$

$$= \sum_{k=-\infty}^{k=Dn} a_k - \sum_{k=-\infty}^{k=D(n-1)} a_k$$

$$= \sum_{k=D(n-1)+1}^{k=Dn} a_k$$

$$= \sum_{k=1}^{k=D} a_{k+D(n-1)}$$

Thus, the output $y_n$ of the circuit is given by $$y_n = d_n - d_{n-1} \quad (6)$$

$$= \sum_{k=1}^{k=D} a_{k+D(n-1)} - \sum_{k=1}^{k=D} a_{k+D(n-2)}$$

$$= \sum_{k=1}^{d=D} a_{k+D(n-1)} - a_{k+D(n-2)}$$

From equations 1 and 6

$$y_n = \sum_{k=1}^{k=D} \left[ \sum_{j=-\infty}^{j=k+D(n-1)} x_j - \sum_{j=-\infty}^{j=k+D(n-2)} x_j \right] \quad (7)$$

$$= \sum_{k=1}^{k=D} \left[ \sum_{j=k+D(n-2)+1}^{j=k+D(n-1)} x_j \right]$$

$$y_n = \sum_{k=1}^{k=D} \sum_{j=1}^{j=D} x_{D(n-2)+k+j}$$

where $x_{D(n-2)+k+j}$ is the number of rising edges in the sampling sub-interval D(n−2)+k+j. From equation 7 it will be seen that the output of the circuit of FIG. 2 is a triangularly weighted sum of the rising edge counts in each sampling sub-interval from $x_{D(n-2)+2}$ to $x_{Dn}$.

Taking as an example the case where D=4, $y_1=x_{-2}+2x_{-1}+3x_0+4x_1+3x_2+2x_3+x_4$, $y_2=x_2+2x_3+3x_4+4x_5+3x_6+2x_7+x_8$ and so on. Thus, the circuit divides the decimation interval into 2D−1 non-overlapping sub intervals, counts the number of rising edges in each sub-interval, multiplies each count by a corresponding weight and sums the result to provide the output $y_n$. To avoid wrap around the modulo $2^m$ must be greater than the number range of equation 7.

Figure 2:
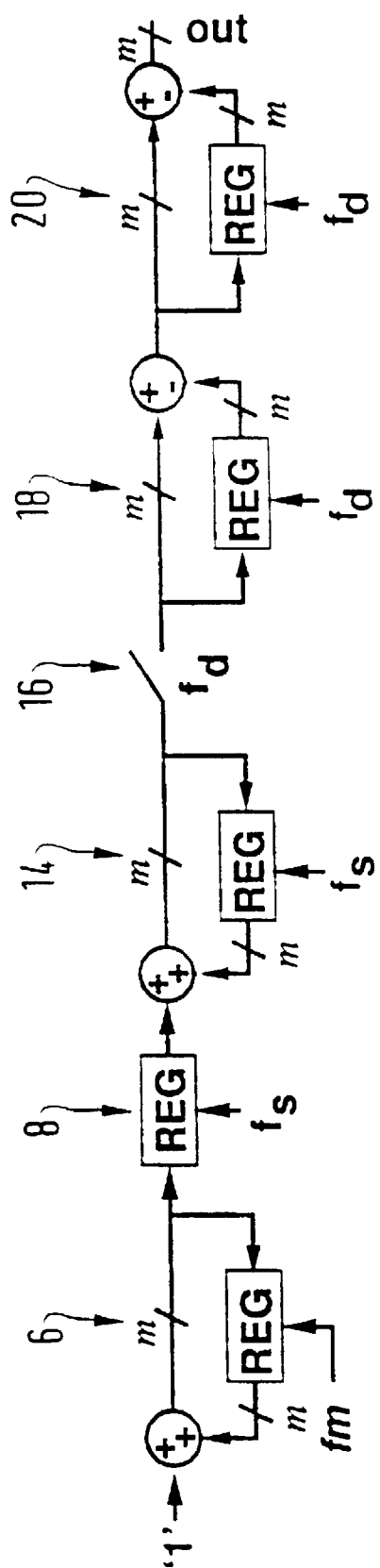
FIG. 2 shows a schematic diagram of a frequency to digital converter according to the invention which is a simplification of the embodiment of FIG. 1.
Figure 3:
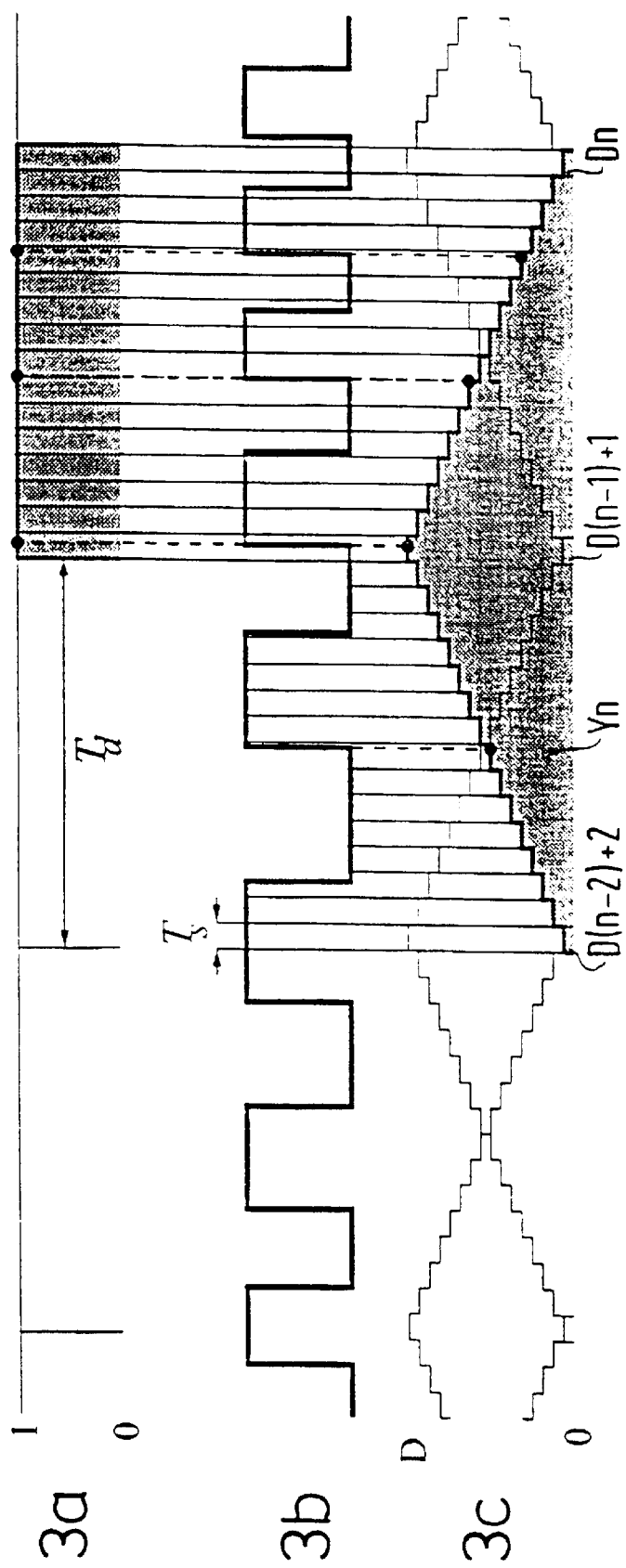
FIG. 3 shows a comparison of the output of the converter of FIG. 2 with that from a known 'count and dump' converter.

FIG. 3 shows the output of the circuit of FIG. 2 compared to that of a traditional count and dump frequency to digital converter. FIG. 3a shows the samples of the count and dump frequency to digital converter which are all equally weighted with a weight of 1 in the summed output. FIG. 3b shows the FM signal and FIG. 3c shows the triangularly weighted sampling according to the invention. As is shown in FIG. 3c, the triangular weighting windows of successive outputs overlap by 50%. By exchanging the uniform windowing function of the traditional count and dump frequency to digital converter for a triangularly weighted window, first order delta sigma noise shaping is achieved.

The signal to quantization noise ratio (SQNR) for the circuit of FIG. 2 will be given by $$SQNR(\text{dB}) = 20\log\left(\frac{2\Delta f}{f_s}\right) - 20\log\left(\frac{\sqrt{2}\pi}{3}\right)\left(\frac{f_N}{f_s}\right)^{3/2} \quad (8)$$

where $f_n$ is the Nyquist frequency of the modulating signal. This formula is described in the papers "Novel second-order Δ-Σmodulator/frequency to digital converter", IEEE Electronics Letters Vol. 31, No. 2 pp. 81–82 1995 and "Delta sigma modulators using frequency modulated intermediate values" IEEE J. Solid State Circuits Vol. 32 No. 1 January 1997 by Høvin et al. The first term represents the resolution of an ordinary rising edge counting frequency to digital converter and the second term represents the increased resolution resulting from the delta sigma noise shaping. If the sinc$^2$ decimator is followed by a low pass filter, $f_d$ will normally be chosen as $4f_N$.

Some examples of practical applications of the described circuit will now be described.

EXAMPLE 1

In a digital measurement system using a frequency modulating sensor, where the sensor output specifications are Δf=800 Hz and $f_N$=1 kHz, a traditional counting frequency to digital converter operating at the Nyquist frequency exhibits a maximum digital resolution of 2Δf/$f_N$≈−2 dB equivalet to less than 1 bit. The circuit of the present invention with $f_s$=50 MHz has a resolution of ≈68 dB, equivalent to slightly more than 11 bits.

EXAMPLE 2

In an F.M. audio demodulator, the FM signal specification is Δf=1 MHz, $f_N$=20 kHz. Using CMOS VLSI, the circuit according to the invention should be able to operate with $f_s$>200 MHz which provides more than 77 dB or 12 bit resolution. A traditional counting frequency to digital converter provides a maximum resolution of ≈6 bits.

EXAMPLE 3

Figure 4:
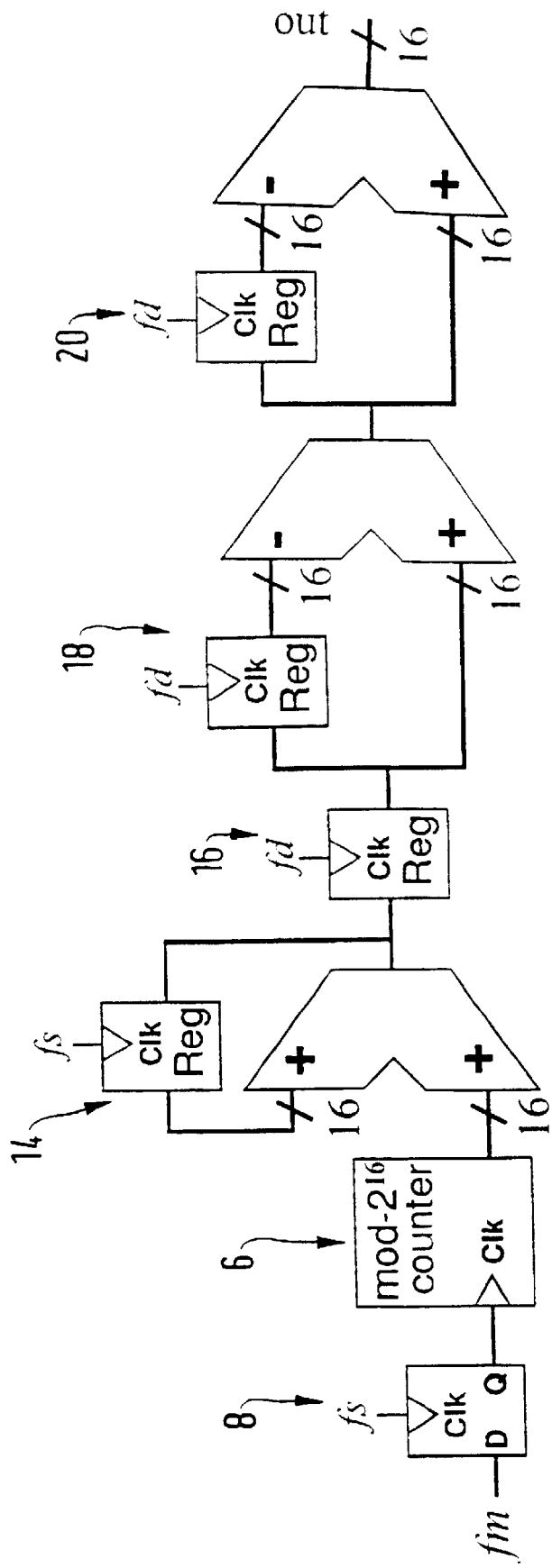
FIG. 4 shows a practical implementation of a frequency to digital converter according to the invention.

A triangularly weighted zero-crossing detector has been implemented in TTL with $f_s$=4 MHz and a maximum modulating signal frequency $f_m$=500 Hz ($f_N$=1 kHz). An FM signal with carrier frequency 610 kHz modulated by a single sinusoidal signal of 271 Hz was provided by a set of HP8116A/HP3245A signal generators. To avoid glitches, the FM signal was synchronized with $f_s$ using a D-latch prior to first-step accumulation, as shown in FIG. 4, and a decimator word-length of 16 bits was chosen.

Figure 5:
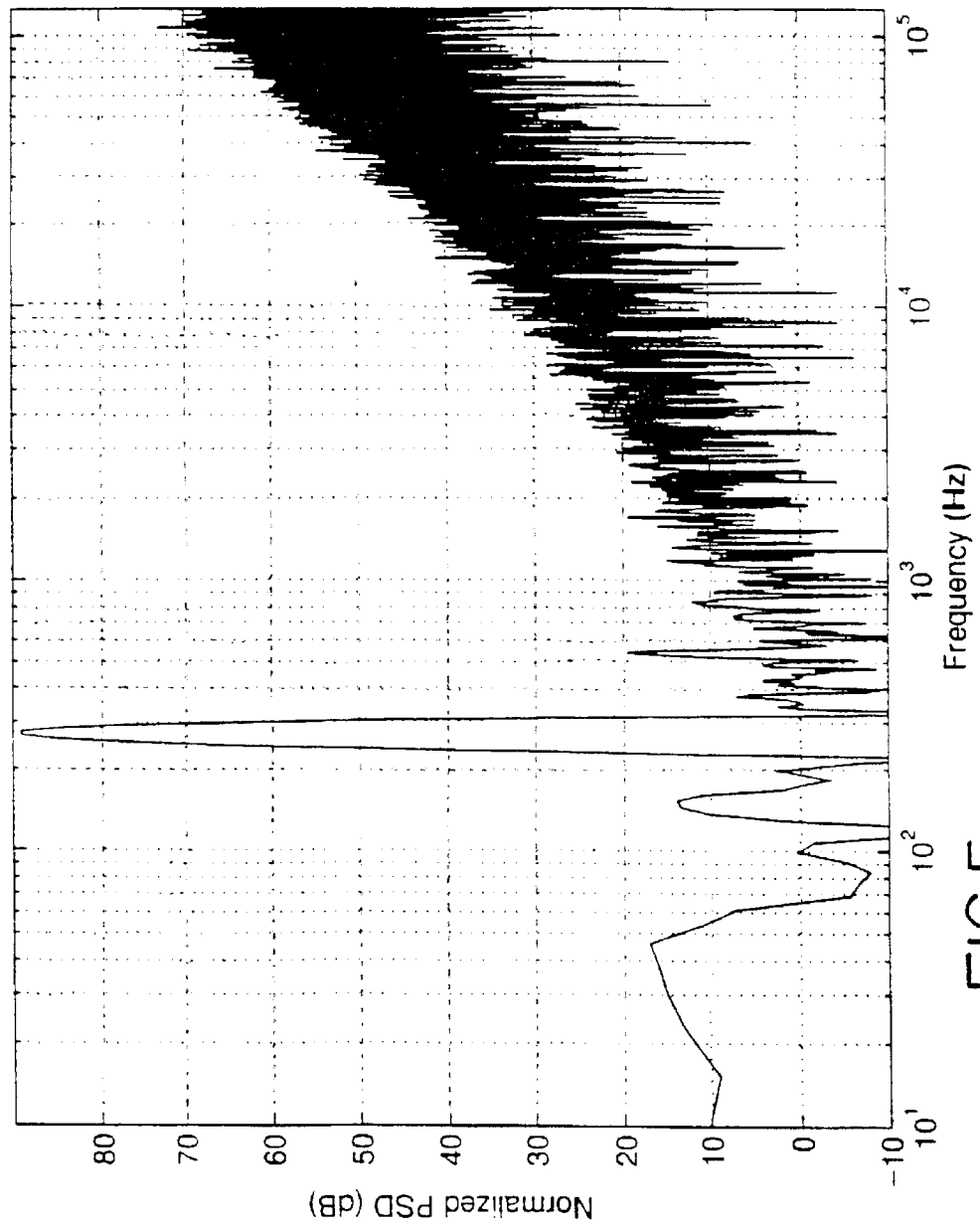
FIG. 5 shows a measured output spectrum for the embodiment of FIG. 4.
Figure 6:
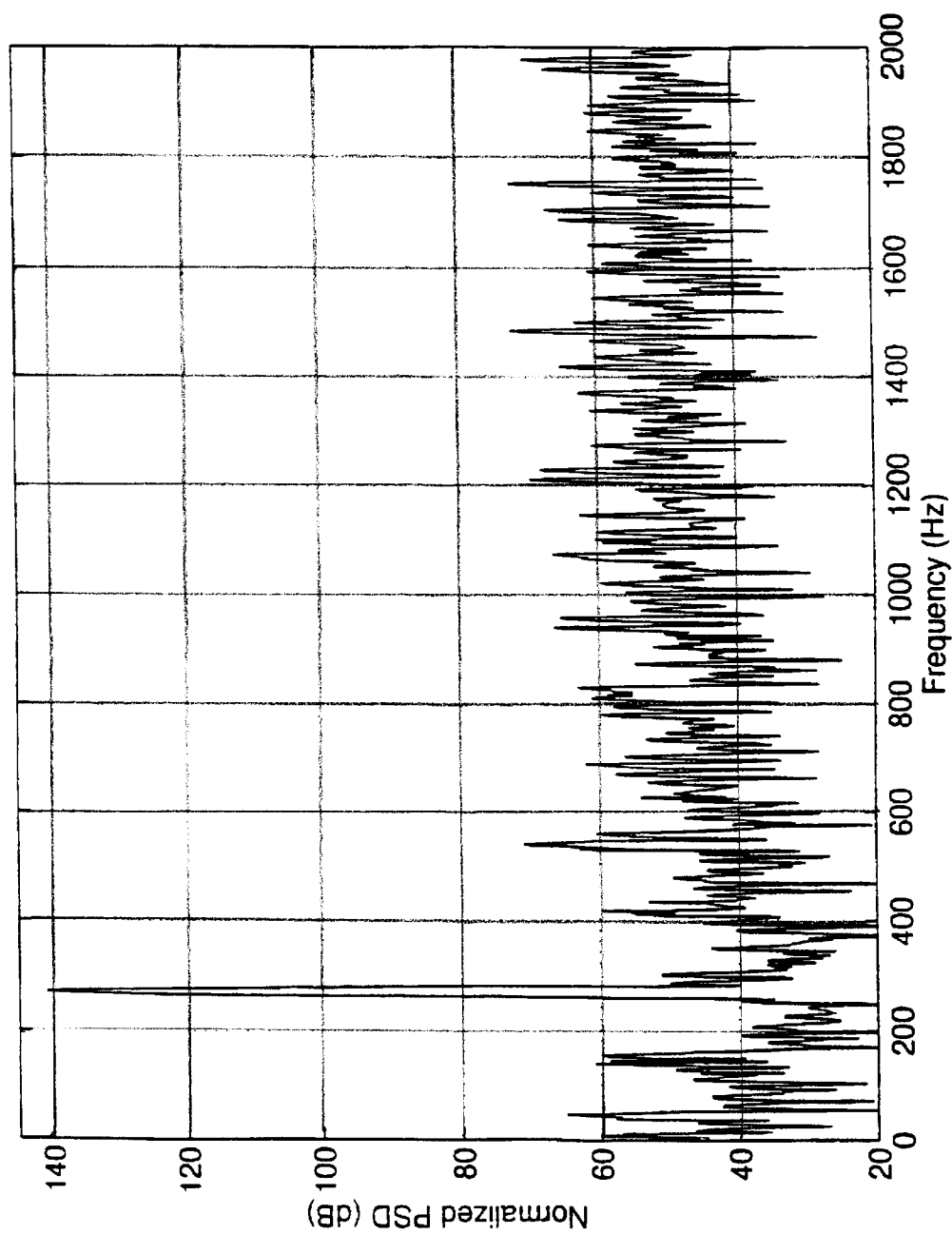
FIG. 6 shows a further measured output spectrum for the embodiment of FIG. 4.

The measured output power spectrum is shown in FIG. 5 for $\Delta f$=60 kHz and a decimation ratio D=16. From the plot of FIG. 5 the shaped quantization error resulting from the delta sigma conversion can be seen in the range 1–100 kHz. For frequencies higher than ≈10 kHz there is some excess noise probably due to the location of the narrow internal signal range ($f_c \pm \Delta f / f_s$=[0.1375, 0.1675] relative to the equivalent quantization levels 0,1. For frequencies lower than ≈1 kHz a noise floor with harmonic distortion corresponding to the spectrum of the signal generator itself appears. The measured output power spectrum for D=1000 is shown in FIG. 6. In this case the output word rate $f_d$ is 4 kHz. If the converter output is properly low pass filtered the SQNR should theoretically from Equation 8 be 74 dB which is a ≈32 dB improvement from a standard zero-crossing counting frequency-to-digital converter running at $f_N$. However, due to noise assumed to originate from the signal generator itself, the measured SNR was found to be 56 dB.

Analog to Digital Conversion by Adding a Frequency Modulator

Figure 7:
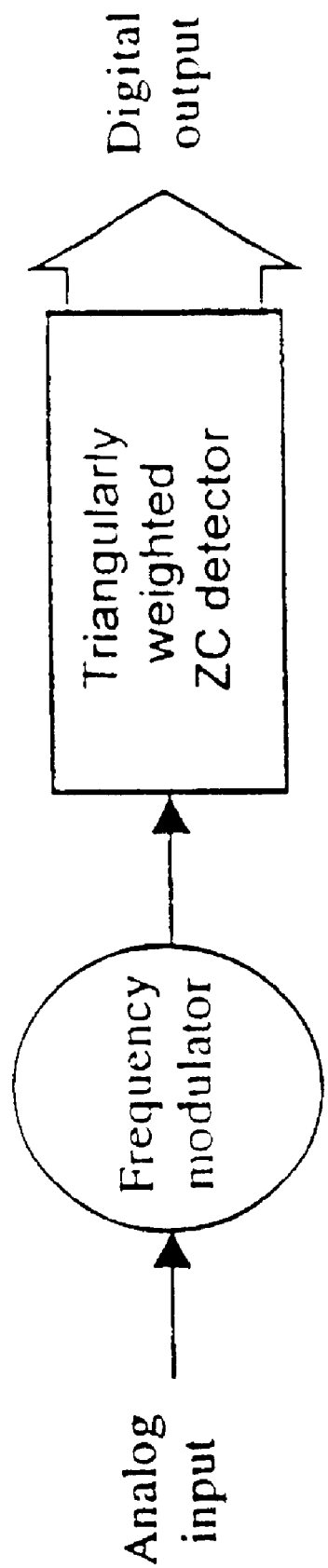
FIG. 7 shows a frequency modulator added to a triangularly weighted zero-cross counter.

By adding a frequency modulator to a triangularly weighted zero-cross (ZC) counter an analog to digital converter can be realised (see FIG. 7). The frequency modulator can for example be implemented by a modulated ring-oscillator. If the ring-oscillator is implemented with inverters then the inverter delay can be modulated in different ways as described below.

Delay Modulation by Inverter Power Supply Modulation

Figure 8:
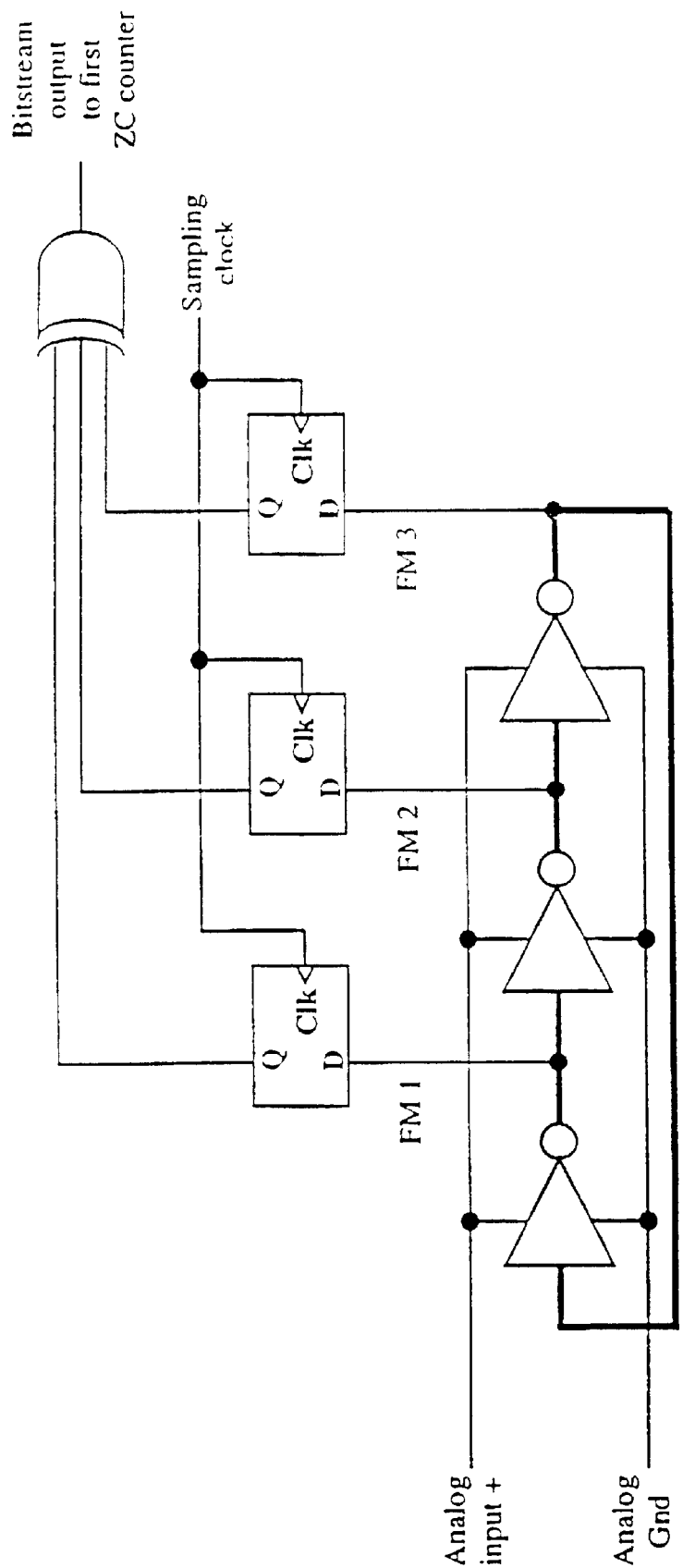
FIG. 8 shows a power supply modulated ring-oscillator.

The frequency of an inverter-based ring-oscillator can be approximated by a linear function of the inverter power supply voltage for a limited frequency range. In FIG. 8 a power supply modulated ring-oscillator is shown where the analog input signal is the power supply voltage of the inverters. In this way an analog to digital converter is provided comprised of digital components only.

The signal at each inverter output is by itself a FM signal and can therefore be sampled and added together to increase the resolution. By sampling each node in this way the ring-oscillator may consist of any odd number of inverters. The resolution is only determined by the single inverter maximum delay variation. By adding all sampled node values in a 3 inverter ring-oscillator the outcome will be restricted to "1" or "2". Thus by using one-bit adders with no carry out bit a constant "1" will be subtracted from the signal. A 3 input one-bit adder with no carry out can be implemented by a 3 input XOR gate (output high only when one of 3 inputs are high).

Delay Modulation by Temperature

By using a reference voltage for inverter power supply the ring-oscillator may be used as a temperature sensor (not shown) since the temperature will directly modulate the transistor gain of the inverters.

Delay Modulation by Pressure/Sound

Figure 9:
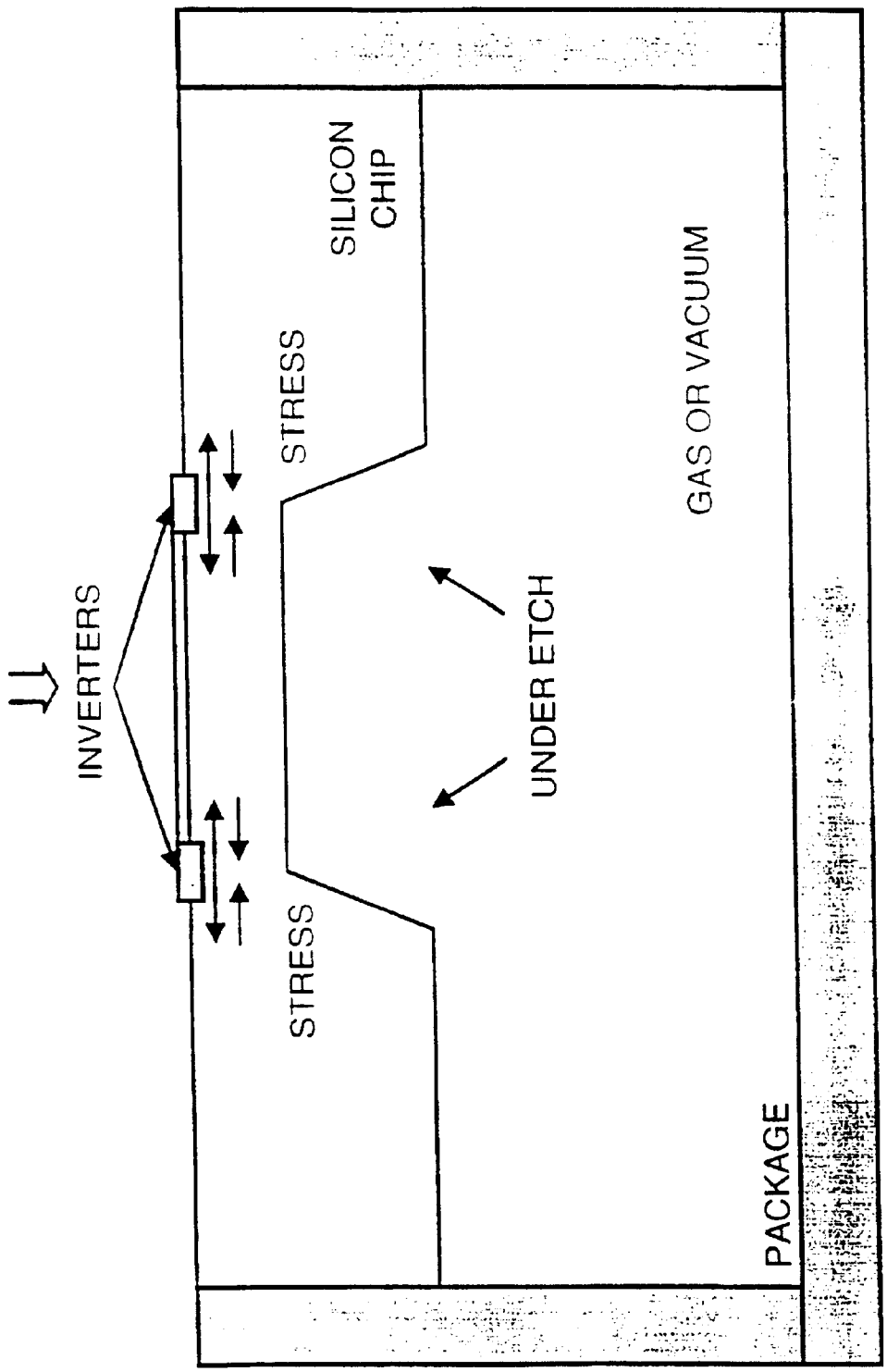
FIG. 9 shows a pressure modulated ring-oscillator.

By implementing the ring-oscillator on a thin silicon membrane and by making one of the walls in a TETT package containing gas or vacuum (see FIG. 9), a pressure modulated ring-oscillator can be provided since the transistor gain will be modulated by stress in the silicon.

Figure 10:
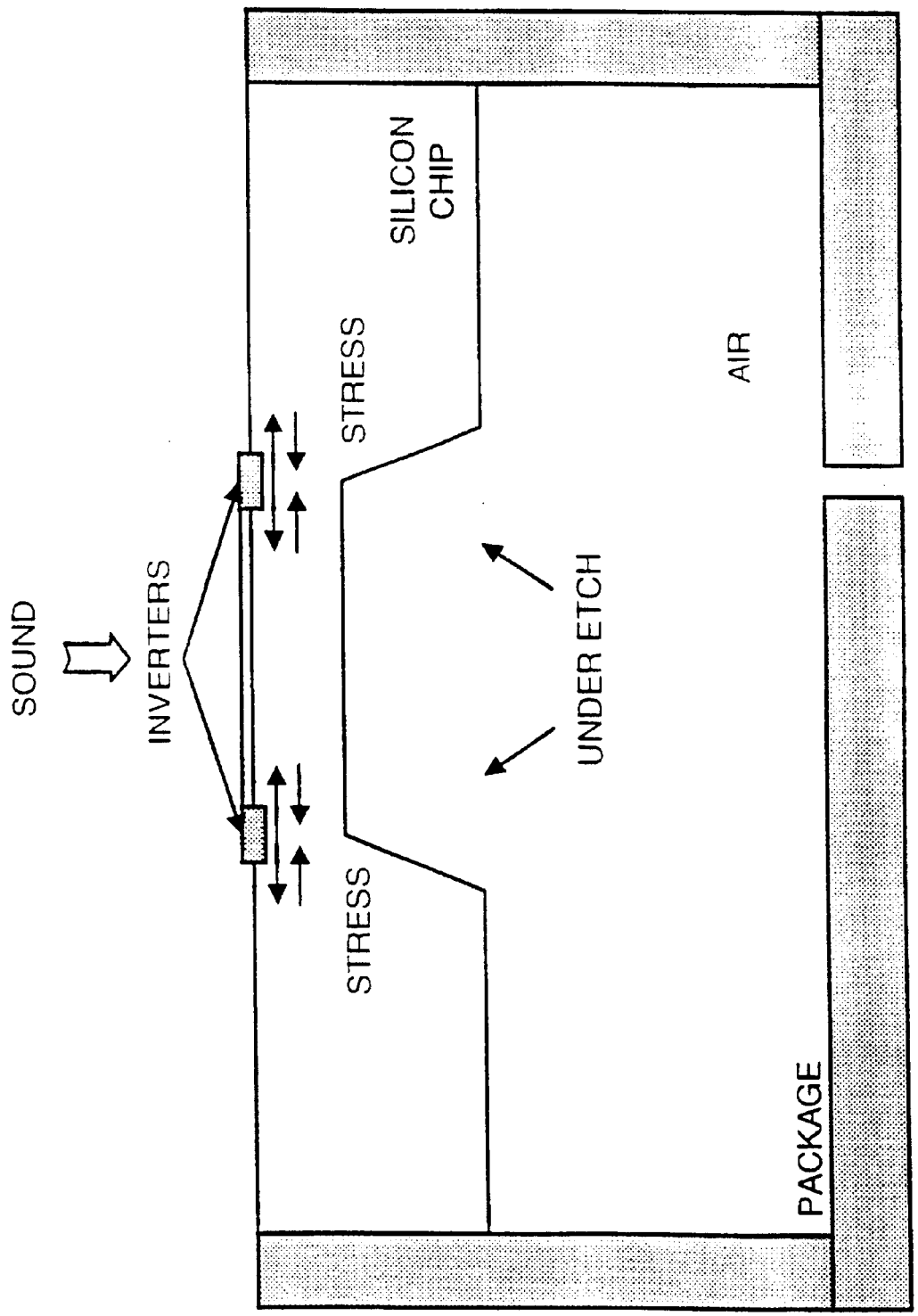
FIG. 10 shows a sound modulated ring-oscillator.

By making a hole in the package so that the package forms an IKKETETT, a sound modulated ring-oscillator can be provided (see FIG. 10).

Delay Modulation by Acceleration

Figure 11:
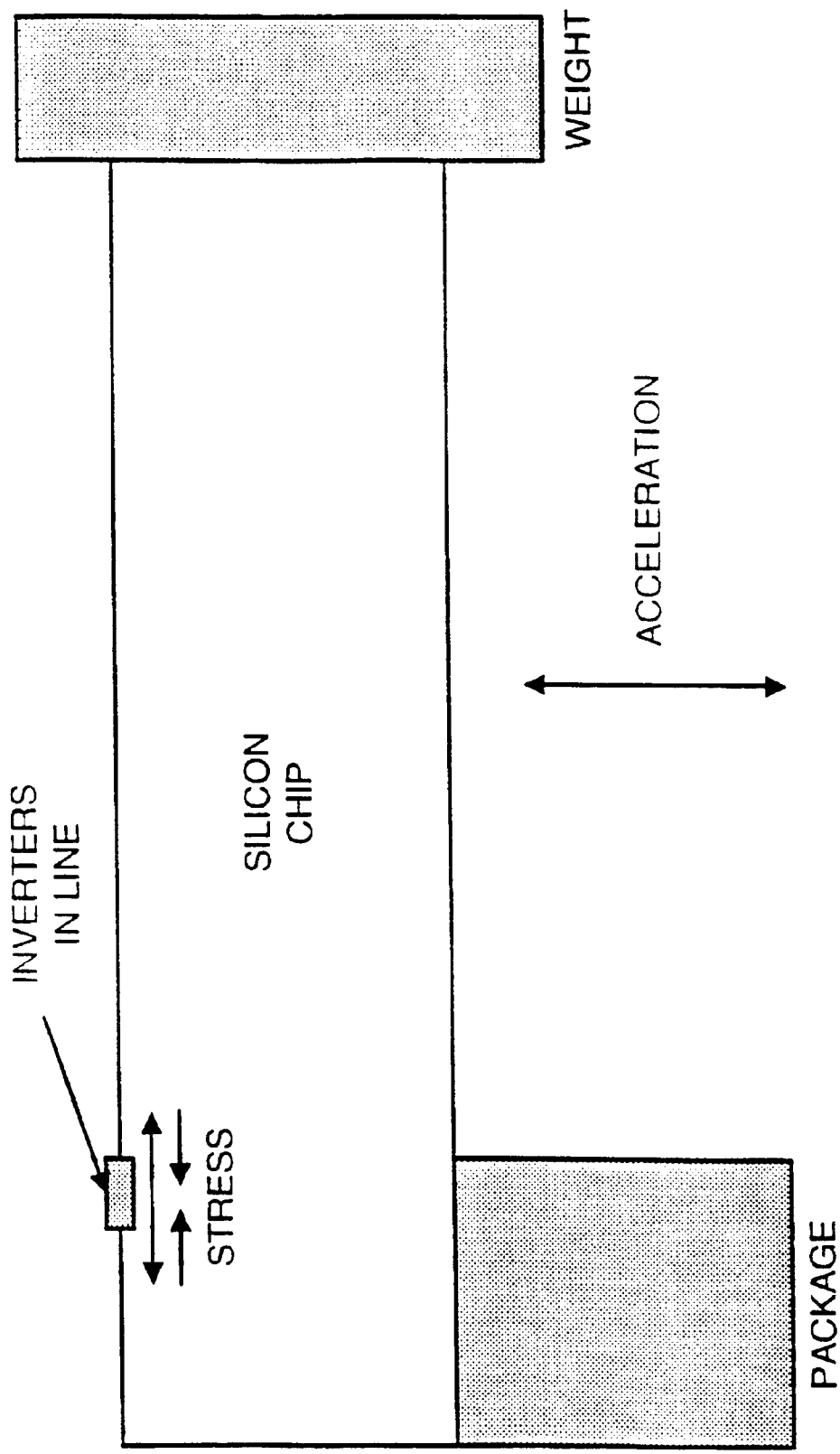
FIG. 11 shows an acceleration modulated ring-oscillator.

By attaching a weight to the free moving end of a silicon die where the other end is fixed to the package, the bending area of the silicon can be exposed to stress resulting from acceleration. Thus by locating the inverters in line in the bending area an acceleration-modulated ring-oscillator can be provided (see FIG. 11).

Second-Order Noise Shaping

A triangularly weighted zero-cross (ZC) counter can be extended to provide equivalent second-order delta-sigma noise shaping by adding an analog stage at the input and also adding a third modulo differentiator/integrator pair.

Figure 12:
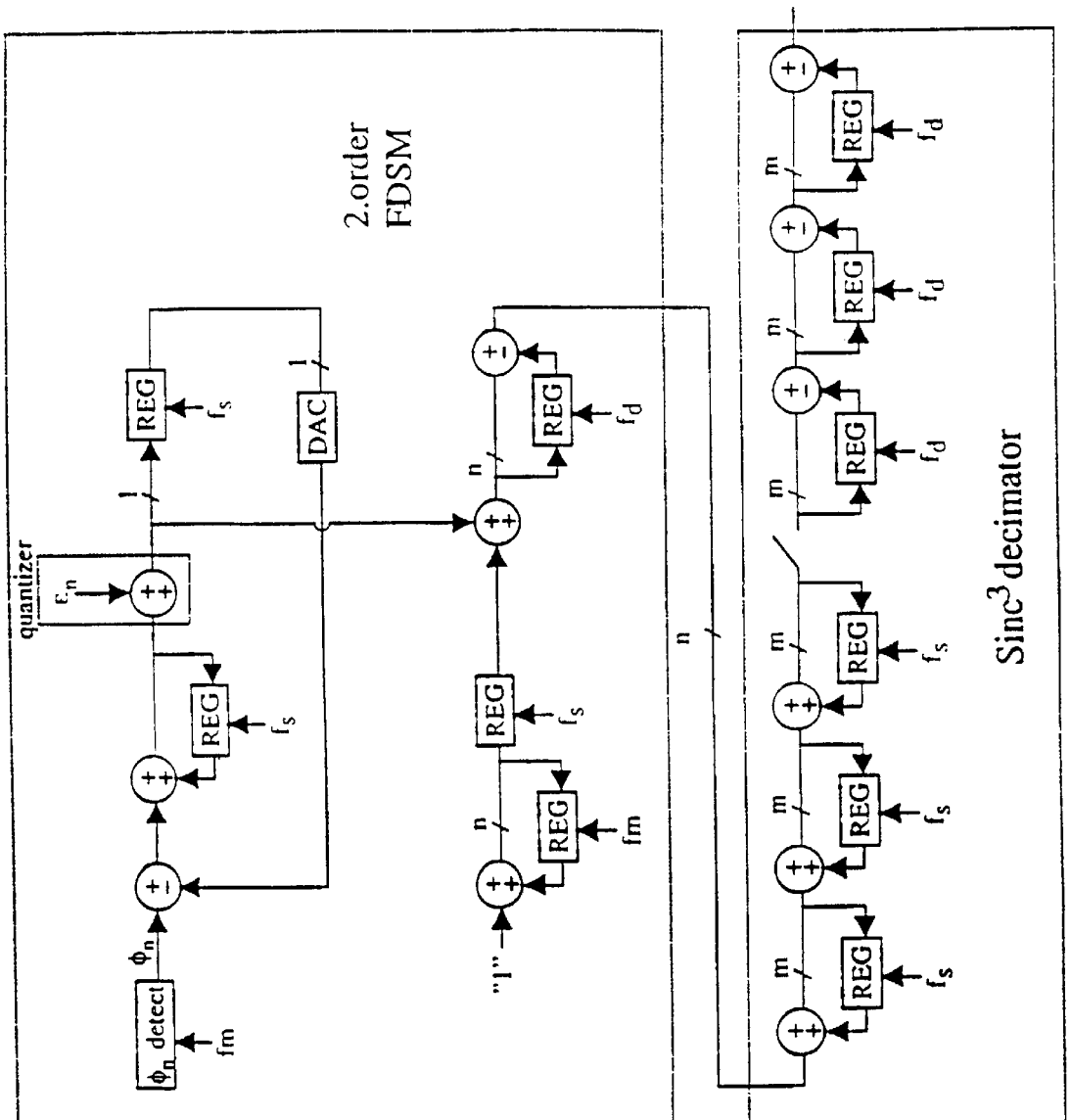
FIG. 12 shows a second order FΔΣM circuit in combination with a sinc$^3$ decimator.

As is discussed in "Delta-Sigma Modulators Using Frequency-Modulated Intermediate Values", (Høvin, M., Olsen, A., Lande, T. S., Tomazou, C., I.E.E.E J. Solid State Circuits, Vol. 32, No. 1, January 1997) and Høvin, M., Master Thesis, UIO 95, pp. 33–68 second order F$\Delta\Sigma$M can be provided as is shown in FIG. 12. For a second order delta-sigma modulator the optimum decimating filter is a $\text{sinc}^3$ decimator and this is shown in FIG. 12.

Figure 13:
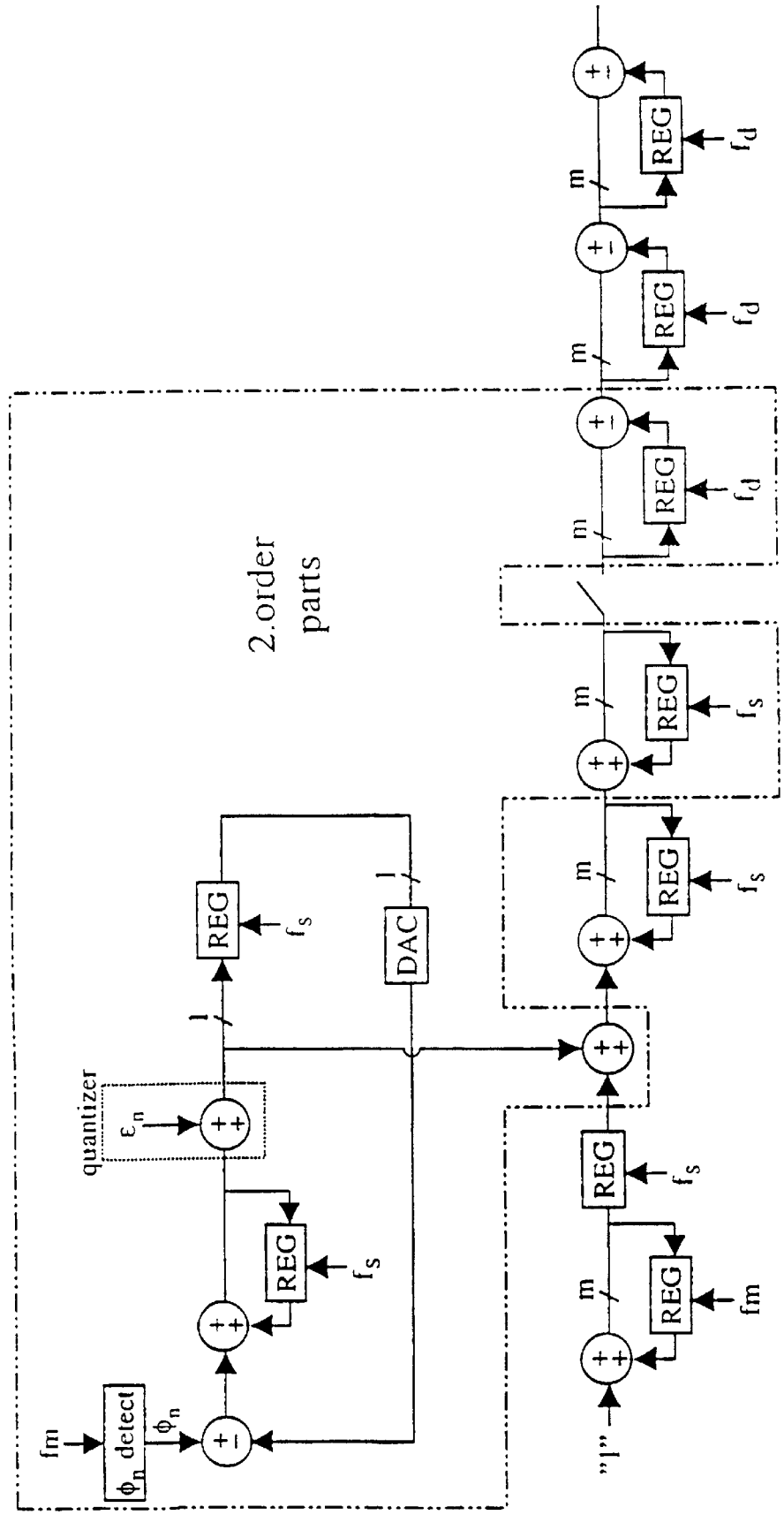
FIG. 13 shows a simplified version of the circuit shown in FIG. 12.

By choosing the same module size in the F$\Delta\Sigma$M output differentiator as for the decimator (n=m) this circuit can be simplified as is shown in FIG. 13. In this circuit the F$\Delta\Sigma$M output differentiator is cancelled by the decimator input accumulator. All additional parts needed for second-order operation are shown inside the dashed box. The circuit outside this box is a first-order triangularly weighted ZC counter.

Figure 14:
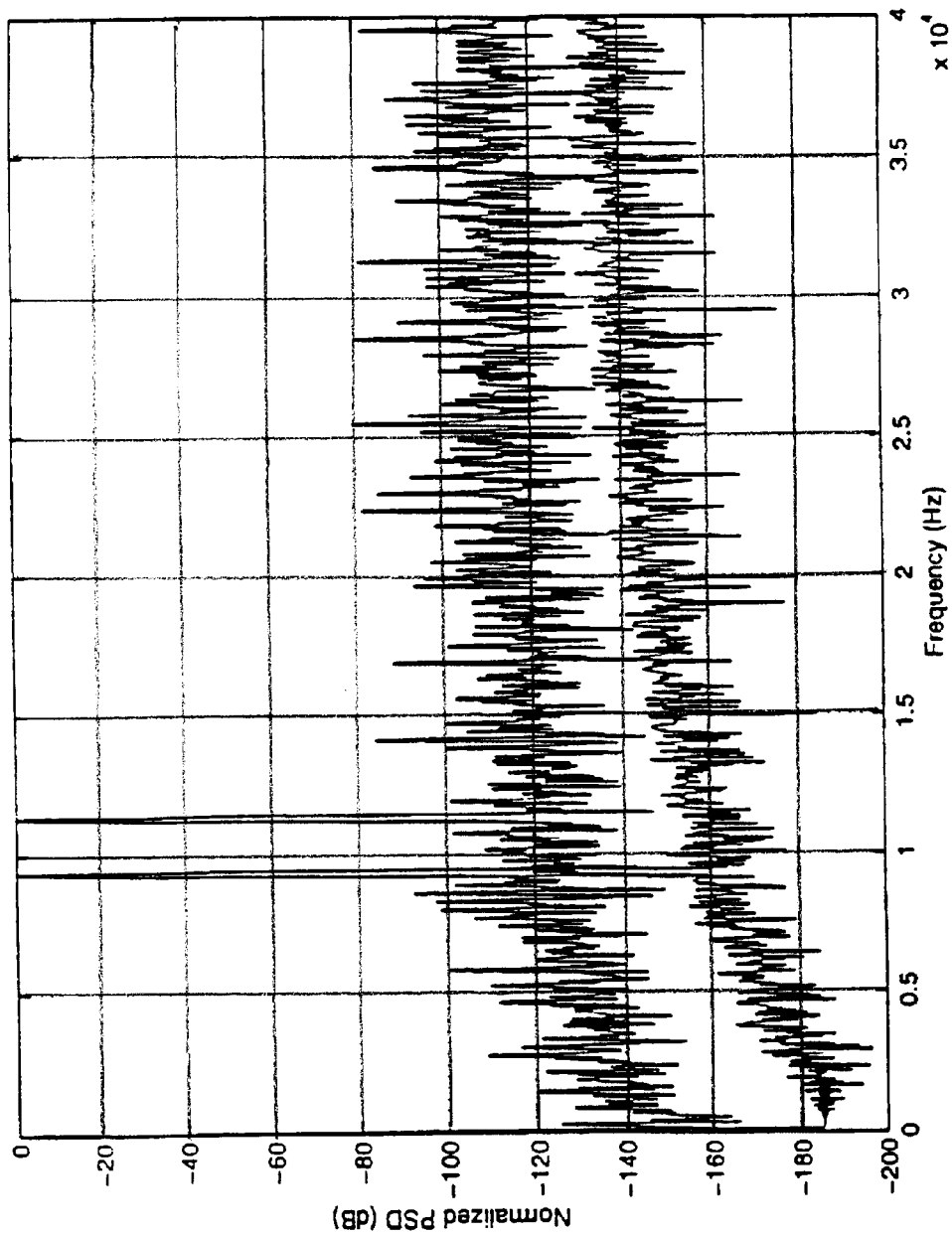
FIG. 14 shows the simultated output spectra for first and second order FΔΣM circuits.

FIG. 14 shows a simulated output spectrum for both a first-order triangularly weight ZC counter (upper data) and for second-order operation as shown in FIG. 13 (lower data). For both simulations: $f_s$=40 MHz, $f_d$=312 kHz, FM carrier frequency=50 MHz, max FM deviation 5 MHz, word-length=20 bit. For the first-order circuit: modulating signal= 11 kHz, modified circuit: 9 KHz. An increased noise-shaping ability for the second-order circuit is clearly demonstrated.

What is claimed is:

1. A method of converting an oscillating signal to a digital signal representative of the frequency of the oscillating signal over a sampling interval T, wherein the occurrence of corresponding points of successive cycles of the oscillating signal are counted, the count is sampled at a first sampling frequency $f_s$, where $1/f_s$<T, to give a plurality of values of the count for a plurality of sampling sub-intervals $T_s$ and the sub-interval counts are summed to provide an output, characterised in that each sampled count value is weighted by a weight which is a function of the position of the respective sub-interval $T_s$ in the interval T.

2. A method as claimed in claim 1, wherein the weighting function has a minimum value at the start and end of the sampling interval T.

3. A method as claimed in claim 2, wherein the weighting function has a maximum at the centre of the sampling period T.

4. A method as claimed in claim 1, wherein the weighting function is symmetrical about the centre of the sampling period T.

5. A method as claimed in claim 1, wherein the weighting function is triangular.

6. A method as claimed in claim 1, wherein the sampling periods of successive output values overlap.

7. A method as claimed in claim 1, wherein the count sampled at the first sampling frequency $f_s$ is summed over successive sampling sub-intervals $T_s$, the summed counts are sampled at a second sampling frequency $f_d$ and are then differentiated twice by successive differentiators clocked at the second sampling frequency $f_d$ to provide an output.

8. A method as claimed in claim 7 wherein the summed sampled output is further summed over successive sampling sub-intervals $T_s$ and these further summed counts are sampled at the second sampling frequency $f_d$ and wherein the output is further differentiated by differentiators clocked at the second sampling frequency $f_d$ to provide an output.

9. A method as claimed in claim 1, wherein the oscillating signal is a frequency modulated signal.

10. A method as claimed in claim 1, wherein the rising or falling edges of the oscillating signal are counted.

11. A method of analogue-to-digital conversion, wherein a carrier signal is frequency modulated with an analogue signal and the resultant frequency modulated signal is converted to a digital signal by a method according to claim 1.

12. A method as claimed in claim 11, wherein the carrier signal is generated by a ring oscillator.

13. A method as claimed in claim 12, wherein said modulated ring-oscillator comprises a plurality of inverters having an inverter delay which can be modulated.

14. A method as claimed in claim 13, wherein the inverter delay is modulated by arranging the analogue signal to form at least one power supply voltage of the inverters.

15. A method as claimed in claim 13, wherein the inverter delay is modulated by temperature.

16. A method as claimed in claim 13, wherein the inverter delay is modulated by pressure.

17. A method as claimed in claim 13, wherein the inverter delay is modulated by acceleration.

18. A converter for converting an oscillating signal to a digital signal representative of the frequency of the oscillating signal over a sampling interval T, the converter comprising a counter arranged to continuously count cycles of the oscillating signal and a sampler arranged to sample the output of the counter at a sampling frequency $f_s$, where $1/f_s < T$, to give a plurality of sub-interval counts corresponding to each of a plurality of sampling sub-intervals $T_s$ and the sub-interval counts are summed to provide an output, characterised in that the converter further comprises weighting means for assigning a weight to each sub interval count which is a function of the position of the corresponding sub-interval $T_s$ in the interval T to produce an output in the form of a weighted sum of the sampled counts over the sampling interval T.

19. A converter as claimed in claim 18, wherein the weighting means comprises an accumulator, the output of which is sampled at a decimation frequency $f_d$, followed by two differentiators clocked at the decimation frequency $f_d$.

20. A converter as claimed in claim 18, wherein the weighting means comprises an accumulator, the output of which is sampled at a decimation frequency $f_d$, followed by three differentiators clocked at the decimation frequency $f_d$.

21. An analogue to digital converter comprising a frequency modulator arranged to modulate a carrier frequency with an analogue signal, and a converter as claimed in claim 18, wherein the output of the frequency modulator is applied to the input of the converter.

22. An analogue to digital converter as claimed in claim 21, wherein the frequency modulator comprises a modulated ring-oscillator.

23. An analogue to digital converter as claimed in claim 22, wherein the modulated ring-oscillator comprises a plurality of inverters having an inverter delay which can be modulated.

24. An analogue to digital converter as claimed in claim 23, wherein the inverter delay is modulated by arranging the analogue signal to form at least one of the power supply voltages of the inverters.

25. An analogue to digital converter as claimed in claim 23, wherein the inverter delay is modulated by temperature.

26. An analogue to digital converter as claimed in claim 23, wherein the inverter delay is modulated by pressure.

27. An analogue to digital converter as claimed in claim 23, wherein the inverter delay is modulated by acceleration.

* * * * *